United States Patent
Wang et al.

(10) Patent No.: US 9,653,404 B1
(45) Date of Patent: May 16, 2017

(54) OVERLAY TARGET FOR OPTICALLY MEASURING OVERLAY ALIGNMENT OF LAYERS FORMED ON SEMICONDUCTOR WAFER

(71) Applicant: UNITED MICROELECTRONICS CORP., Hsin-Chu (TW)

(72) Inventors: Yi-Jing Wang, Tainan (TW); En-Chiuan Liou, Tainan (TW); Mei-Chen Chen, Tainan (TW); Han-Lin Zeng, Tainan (TW); Chia-Hung Lin, Tainan (TW); Chun-Chi Yu, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/245,161

(22) Filed: Aug. 23, 2016

(51) Int. Cl.
*H01L 23/544* (2006.01)

(52) U.S. Cl.
CPC .. *H01L 23/544* (2013.01); *H01L 2223/54426* (2013.01)

(58) Field of Classification Search
CPC .................................................... H01L 23/544
See application file for complete search history.

(56) References Cited

U.S. PATENT DOCUMENTS

| | | | |
|---|---|---|---|
| 4,423,959 A * | 1/1984 | Nakazawa | B23K 26/042 356/400 |
| 5,087,537 A * | 2/1992 | Conway | B82Y 10/00 250/491.1 |
| 5,106,432 A | 4/1992 | Matsumoto | |
| 5,172,190 A * | 12/1992 | Kaiser | G03F 9/7076 250/548 |
| 5,721,619 A * | 2/1998 | Hiruma | G03F 7/70633 250/548 |
| 6,023,338 A * | 2/2000 | Bareket | G03F 7/70633 257/E21.53 |
| 6,855,464 B2 | 2/2005 | Niu | |
| 7,038,777 B2 | 5/2006 | Kim | |
| 7,170,604 B2 | 1/2007 | Sezginer | |
| 7,541,201 B2 | 6/2009 | Ghinovker | |
| 8,781,211 B2 | 7/2014 | Ghinovker | |
| 8,842,294 B2 * | 9/2014 | Minoda | G03F 7/0002 356/399 |
| 2001/0018238 A1 * | 8/2001 | Kim | H01L 27/14609 438/145 |
| 2003/0021466 A1 * | 1/2003 | Adel | G03F 7/70633 382/151 |

(Continued)

*Primary Examiner* — Jarrett Stark
(74) *Attorney, Agent, or Firm* — Winston Hsu; Scott Margo

(57) ABSTRACT

The present invention provides an overlay target. The overlay target includes a plurality of first pattern blocks and a plurality of second pattern blocks. The first pattern blocks and the second patterns blocks are arranged in array by being separated by at least one first gaps stretching along a first direction and at least one second gaps stretching along a second direction. Each first pattern block is composed of a plurality of first stripe patterns stretching along a third direction, and each second pattern block is composed of a plurality of second stripe patterns stretching along a fourth direction. The first direction is orthogonal to the second direction, the third direction and the fourth direction are 45 degrees relative to the first direction.

20 Claims, 7 Drawing Sheets

(56) References Cited

U.S. PATENT DOCUMENTS

| | | | | |
|---|---|---|---|---|
| 2003/0063706 | A1* | 4/2003 | Ikeda | H01L 27/14659 378/98.8 |
| 2005/0158906 | A1* | 7/2005 | Sato | H01L 27/14609 438/48 |
| 2005/0285283 | A1* | 12/2005 | Huggins | H01L 21/3212 257/797 |
| 2007/0052113 | A1* | 3/2007 | Marokkey | G03F 7/70633 257/797 |
| 2008/0138604 | A1* | 6/2008 | Kenney | G06K 7/12 428/323 |
| 2008/0297709 | A1* | 12/2008 | Eguchi | G02F 1/134363 349/139 |
| 2009/0224413 | A1* | 9/2009 | Ghinovker | G03F 7/70633 257/797 |

* cited by examiner

OVERLAY TARGET FOR OPTICALLY MEASURING OVERLAY ALIGNMENT OF LAYERS FORMED ON SEMICONDUCTOR WAFER

BACKGROUND OF THE INVENTION

1. Field of the Invention

The present invention is related to an overlay target, and more particularly, to an overlay target for optically measuring overlay alignment of layers formed on a semiconductor wafer.

2. Description of the Prior Art

In a variety of manufacturing and production settings, there is a need to control alignment between various layers or within particular layers of a given sample. For example, in the context of semiconductor processing, semiconductor-based devices may be produced by fabricating a series of layers on a substrate, some or all of the layers including various structures. The relative position of the structures both within a single layer and with respect to structures in other layers is critical to the performance of the devices. The misalignment between various structures is known as overlay error.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below and to the determination of how accurately a first pattern aligns with respect to a second pattern disposed on the same layer. Presently, overlay measurements are performed via test patterns that are printed together with layers of the wafer. However, there are some shortcomings of conventional solutions such as asymmetry of patterned line profile that may bring to measurement error due to the inconsistent in x/y overlay direction measurement.

SUMMARY OF THE INVENTION

The present invention therefore provides an overlay target for optically measuring overlay alignment of layers formed on a semiconductor wafer, which can suffer from the inconsistent in a two dimensional overlay measurement system, such as in x-y overlay direction measurement.

According to one embodiment, an overlay target is provided. The overlay target includes a plurality of first pattern blocks and a plurality of second pattern blocks. The first pattern blocks and the second patterns blocks are arranged in array by being separated by at least one first gaps stretching along a first direction and at least one second gaps stretching along a second direction. Each first pattern block is composed of a plurality of first stripe patterns stretching along a third direction, and each second pattern block is composed of a plurality of second stripe patterns stretching along a fourth direction. The first direction is orthogonal to the second direction, the third direction and the fourth direction are 45 degrees relative to the first direction.

Since there is 45 degrees between the third direction which the first pattern block extends along and the first direction which the border of the first pattern block extends along, the measurement for the overlay mark can be well compensated and a precise result of the manufacturing process can therefore be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
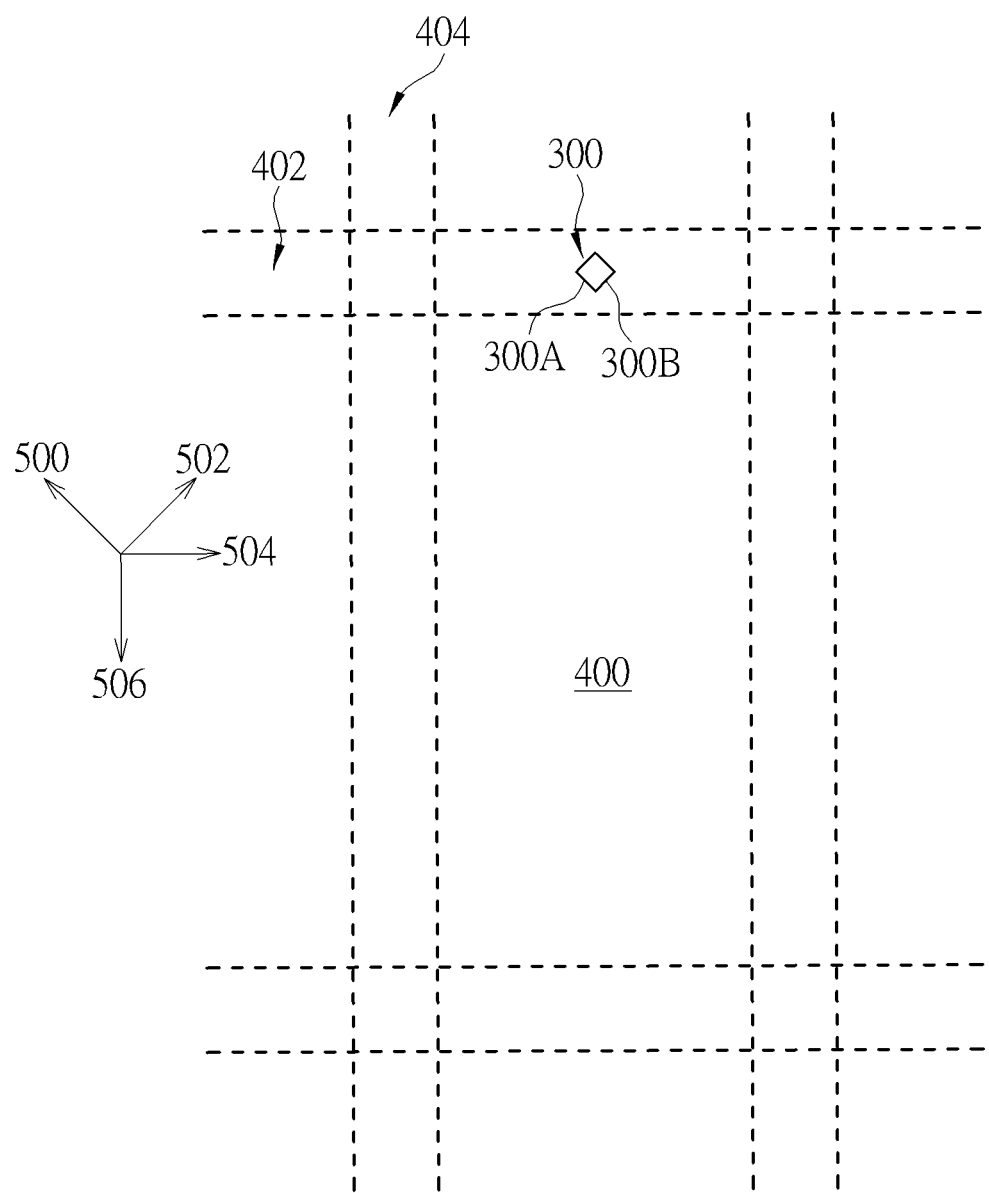
FIG. 1 and FIG. 2, which show schematic diagrams of the overlay target according to one embodiment of the present invention.
Figure 2:
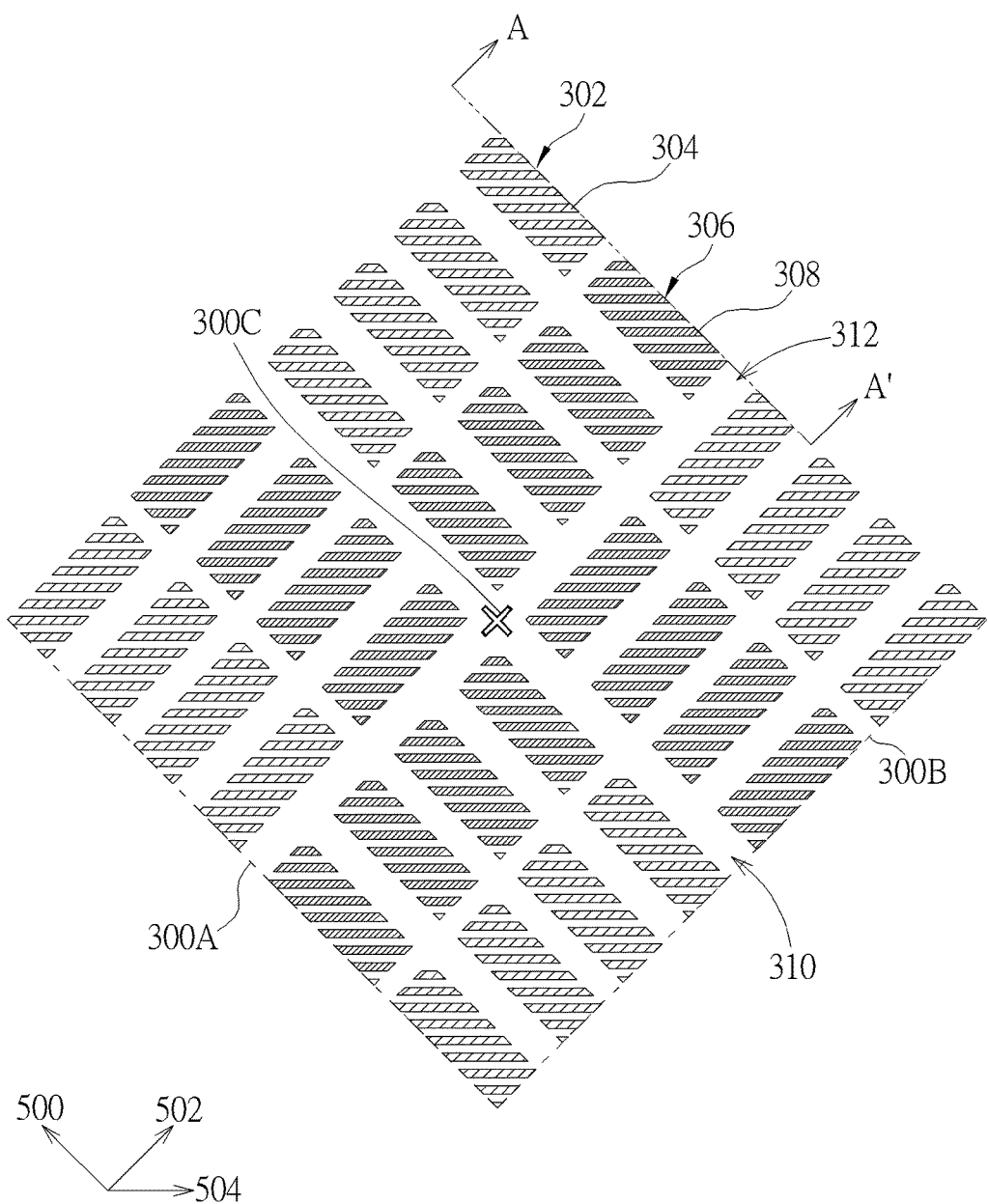

Please refer to FIG. 1 and FIG. 2, which show schematic diagrams of the overlay target according to one embodiment of the present invention. As shown in FIG. 1, the overlay target 300 in the present invention is disposed on a wafer (not shown) with a first direction 500, a second direction 502, a third direction 504 and a fourth direction 506. The first direction 500 is substantially perpendicular to the second direction 502, the third direction 504 is perpendicular to the fourth direction 506, wherein the third direction 504 is 45 degrees relative to the third direction 502.

A plurality of die regions 400, a plurality of first scribe line regions 402 and a plurality of second scribe line regions 404 are provided on the wafer, wherein the first scribe line regions 402 stretch along the third direction 504, and the second scribe line region 404 stretch along the fourth direction 406 so that the die regions 400 are arranged in array and are separated by the first scribe lines 402 and the second scribe lines 404. In the present invention, the overlay mark 300 is disposed in a middle portion of the first scribe line 402 (as shown in FIG. 1) or a middle portion of the second scribe line 404. In another embodiment, the overlay mark 300 can be disposed in an intersection region of the first scribe line 402 and the second scribe line 404 (not shown in FIG. 1). It is noted that although one overlay mark of the present invention is sufficient, a plurality of overlay marks can be produced to further enhance the precision of the alignment process by allowing information, such as that indicative of the angular position or the degree of distortion of an image, to be discerned.

As shown in FIG. 1, an outmost contour of the overlay mark 300 is a parallelogram, preferably a rectangle and more preferably a square shape, wherein the outmost contour of the overly mark 300 has a set of borders 300A parallel to the first direction 500 and a set of borders 300B parallel to the second direction 502.

Please refer to FIG. 2, which show an enlarged schematic diagram of the overlay mark according to one embodiment of the present invention. As mentioned above, the overlay mark 300 preferably has a square contour, having a border 300A parallel to the first direction 500, a border 300B parallel to the second direction 502, and a center 300C in the center of the overlay mark 300. The overlay mark 300 is composed of a plurality of first pattern blocks 302 and a plurality of second pattern blocks 306. The first pattern blocks 302 and the second patterns blocks 306 are arranged in array by being separated by at plural first gaps 310 stretching along the first direction 500 and plural second gaps 312 stretching along the second direction 502. In one embodiment, the first gap 310 and the second gap 312 have the same width, however, each first gap 310 can have different length and each second gap 312 can have different length. As such, the contours of the first pattern blocks 302 and the second pattern blocks 306 are preferably rectangle, which has a length 302B and a width 302A (not shown in FIG. 2 but can be shown in an enlarged figure of the first pattern block 302 in FIG. 7). In one embodiment, each first pattern block 302 has the same size, and each second pattern block 304 has the same size, and preferably, each first pattern block 302 and each second pattern block 304 have the same size.

Please refer back to FIG. 2. As shown from the top view of FIG. 2, each first pattern block 302 is composed of a plurality of first stripe patterns 304 and each second pattern block 306 is composed of a plurality of second stripe patterns 308. In one preferred embodiment, the first stripe pattern 304 and the second stripe pattern 308 have trapezoid contours. For example, the first stripe pattern has at least one set of longer border 304L (not shown in FIG. 2 but can be shown in an enlarged figure of the first pattern block 302 in FIG. 7) extending along the third direction 504.

Figure 3:
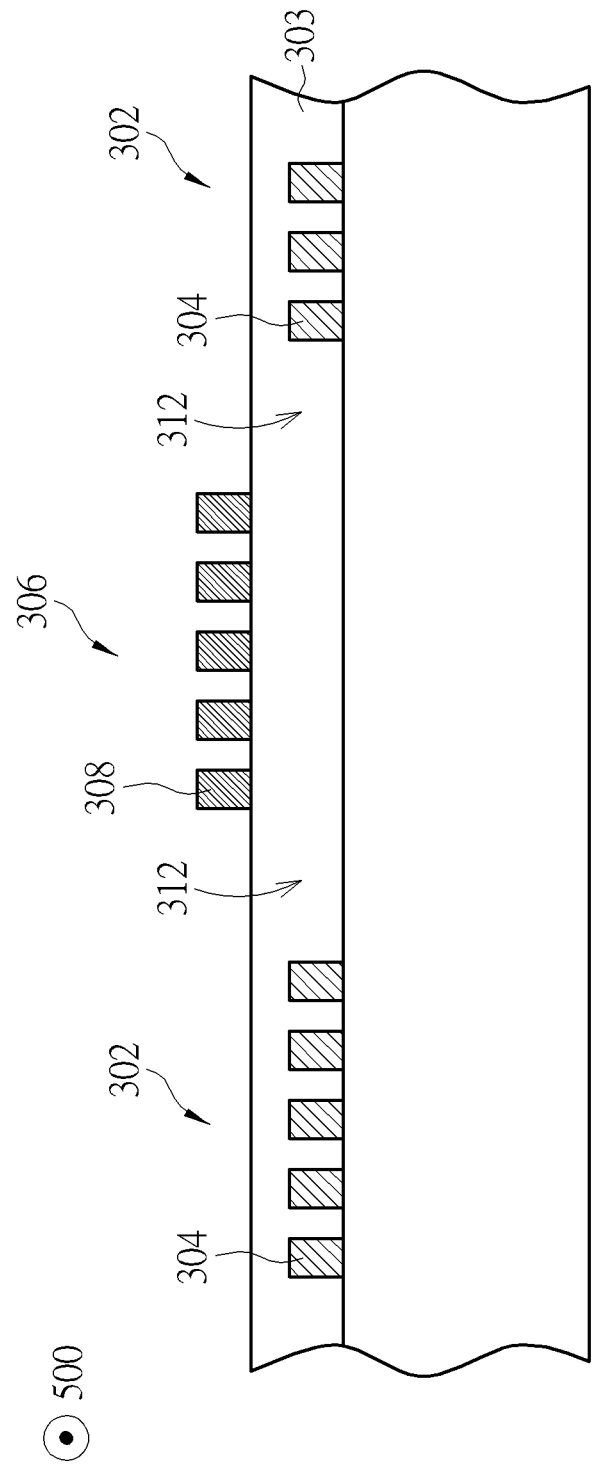
FIG. 3 shows a cross sectional view of the overlay mark taken along line AA' in FIG. 2.

In one embodiment, the first pattern blocks 302 are used as pre-layer mark of the aligning mark 300, and the second pattern blocks 306 are used as current-layer mark of the aligning mark 300, or vice versa. In other words, the first pattern blocks 302 and the second pattern blocks 304 are not disposed in the same layer. Please refer to FIG. 3, which shows a cross sectional view of the overlay mark taken along line AA' in FIG. 2. As depicted from the cross sectional view in FIG. 3, the first pattern blocks 302 are disposed in a first layer 303 and the second pattern blocks 306 are disposed over the first layer 303. In another embodiment, there may be more than one material layer disposed between the first pattern blocks 302 and the second pattern blocks 306. Moreover, since the first pattern block 302 includes plural first stripe pattern 304, a "battlements" structure can be observed in the cross sectional view. Similar structure can be also found in the second pattern block 306.

Figure 4:
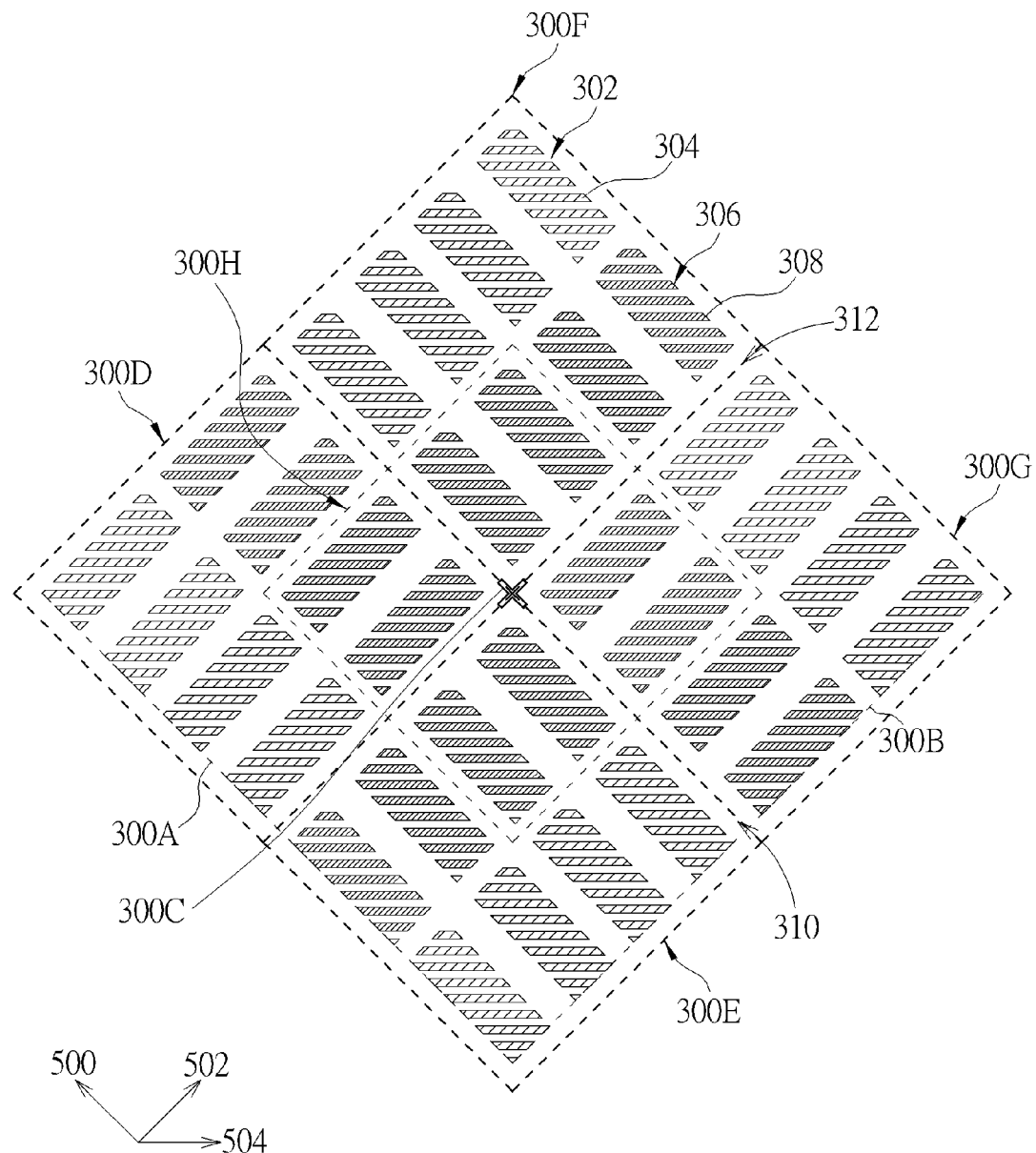
FIG. 4 shows a schematic diagram of the symmetricity of the overlay mark according to one embodiment of the present invention.

Please refer to FIG. 4, which shows a schematic diagram of the symmetricity of the overlay mark according to one embodiment of the present invention. In the present invention, the overlay mark 300 preferably is symmetrical pattern, for example, the overlay mark 300 can be invariant to 180 degrees rotation about the center 300C. In one embodiment for being symmetrical, the overlay mark 300 can be divided into four regions (as shown in FIG. 4), the region 300D, the region 300E, the region 300F and the region 300G, in which each region contains an equal numbers of the first pattern blocks 302 plus the second pattern blocks 306. For example, there are totally 8 of the first pattern blocks 302 plus the second pattern blocks 306 in each region 300D, 300E, 300F or 300G. Additionally, in the same region, the number of the first pattern blocks 302 is equal to the number of the second pattern blocks 306. For example, there are four first pattern blocks 302 and four second pattern blocks 306 in each region 300D, 300E, 300F or 300G. Moreover, there is a central region 300G which is proportionally shrinking from the outmost contour of the overlay mark 300 (for example, ½ scaling down), and there are only the second pattern blocks 306 in the central region 300H. In another embodiment, there can be other symmetrical pattern, such as a cross shape pattern disposed in the central 300C in the central region 300G. It is understood that the above description only shows some embodiments of being symmetrical in the present invention, and other embodiments including scaling up, altering the numbers of the first pattern blocks 302 or second pattern blocks 306, altering the arrangement of the first pattern blocks 302 or the second pattern blocks 306, or even in combination of other conventional aligning marks should also be within the scope the claimed invention.

Figure 5:
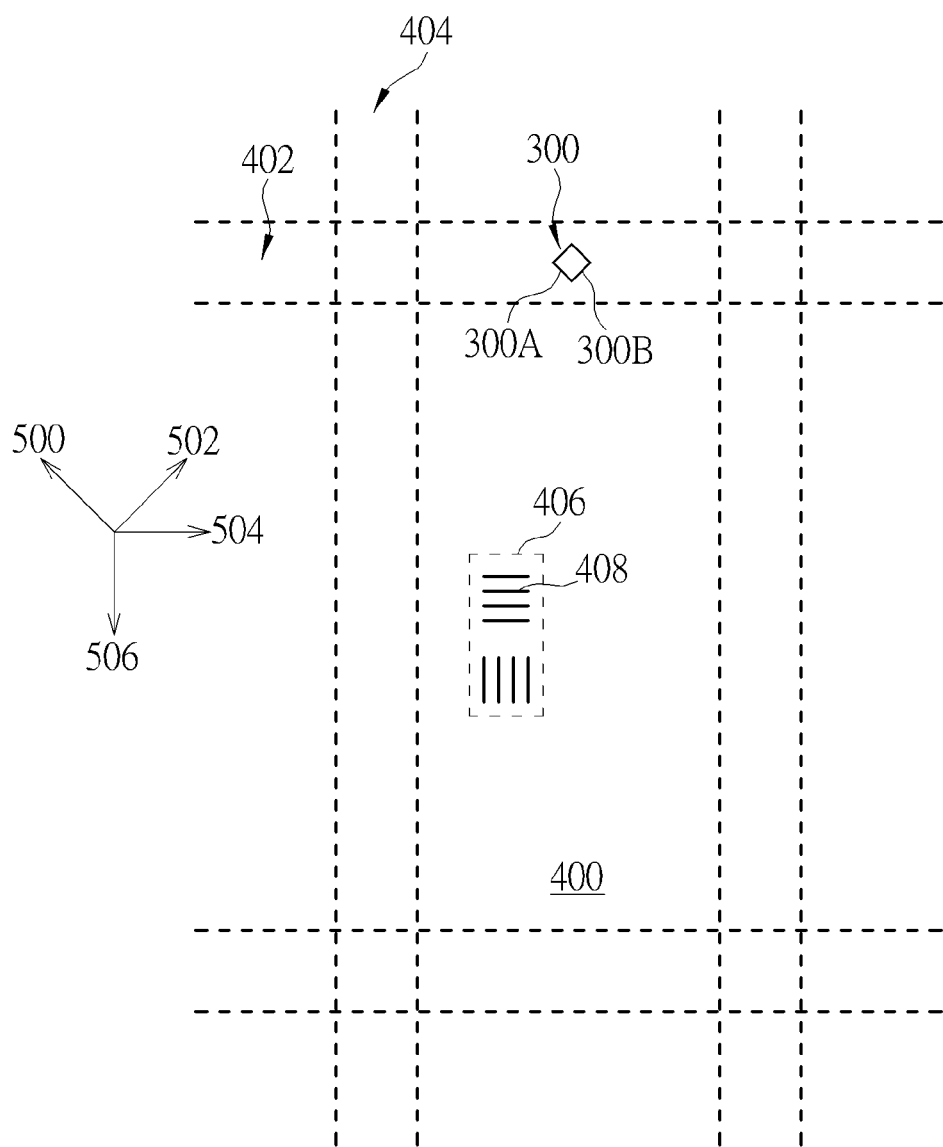
FIG. 5 shows a schematic diagram of the overlay mark according to another embodiment of the present invention.

Please refer to FIG. 5, which shows a schematic diagram of the overlay mark according to another embodiment of the present invention. As shown in FIG. 5, the overlay mark 300 is disposed in the first scribe line 402. An active region 406, such as a memory cell region, is disposed in the die region 400. A plurality of active stripe patterns 408 are disposed in the active region 406, and the active stripe patterns 408 stretch along the third direction 504 or the fourth direction 506, just like the first stripe pattern 304 and/or the second stripe pattern 308. In other words, the active stripe patterns can be formed simultaneously with the first stripe patterns 304 and/or the second stripe patterns 308 so when in the subsequent step, the first stripe pattern 304 and/or the second stripe pattern 308 can be used as aligning marks. In one embodiment, the extending direction of the active stripe patterns 408, the first stripe pattern 304 and second stripe pattern 308 can be determined according to the light source of the exposing systems, such as those using dipole illumination light source. In one embodiment, the extending direction of the active stripe patterns 408, the first stripe pattern 304 and second stripe pattern 308 is perpendicular to the polarization direction of the of the dipole source, thereto get a finer shape of the patterns. In one embodiment, the active stripe pattern 408 is fin pattern that is used by an advanced process such as a "self-aligned double patterning."

Figure 6:
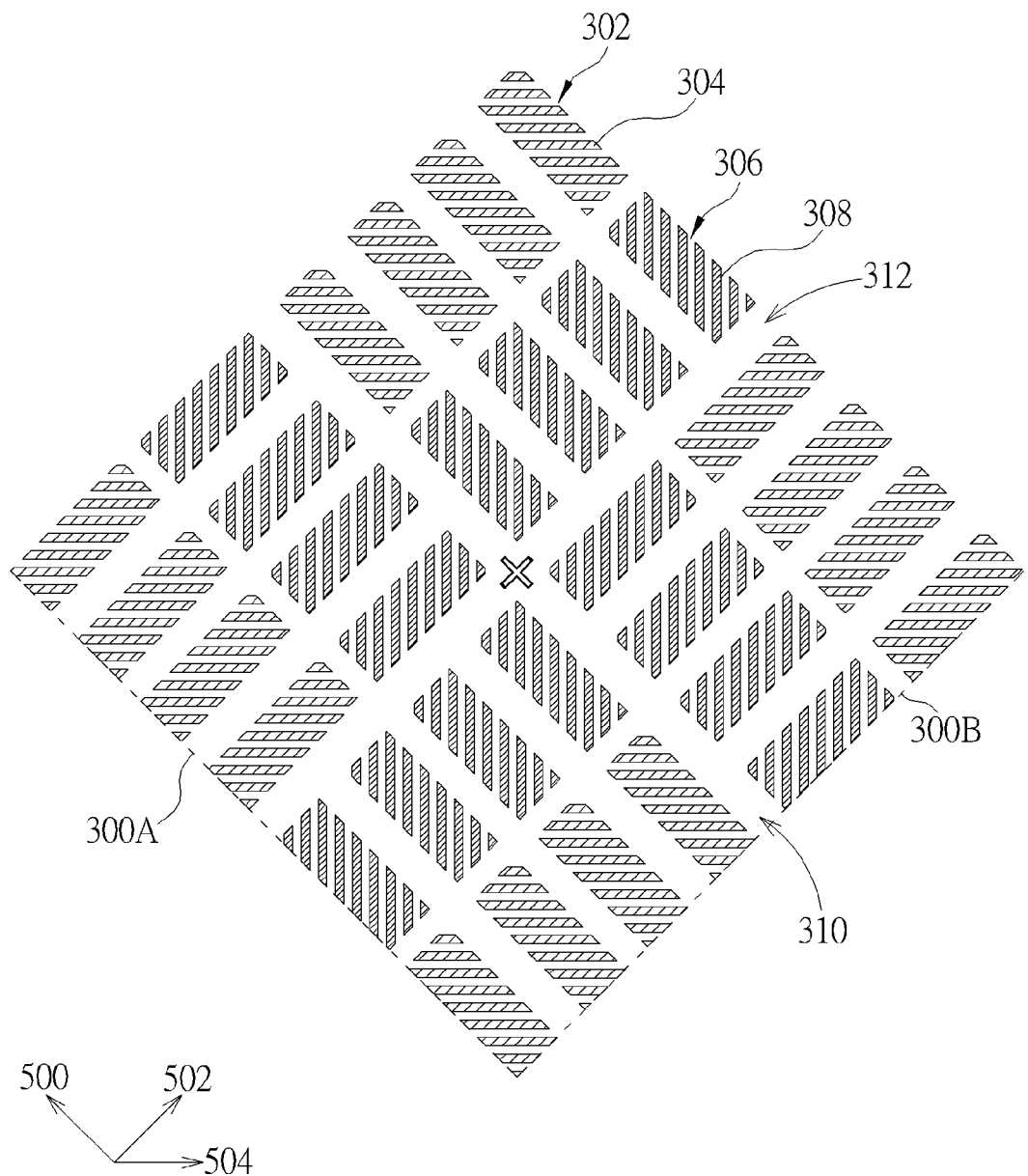
FIG. 6 shows a schematic diagram of the overlay mark according to another embodiment of the present invention.

Please refer to FIG. 6, which shows a schematic diagram of the overlay mark according to another embodiment of the present invention. The overlay mark 300 this embodiment has similar components with the previous embodiment, and repeated description are omitted. Comparing to the previous embodiment, the second stripe pattern 304 in the present embodiment can stretch along the fourth direction 506, which is perpendicular to the third direction 504. That is, the second stripe pattern 304 and the first stripe pattern 302 do not extend to the same direction.

Figure 7:
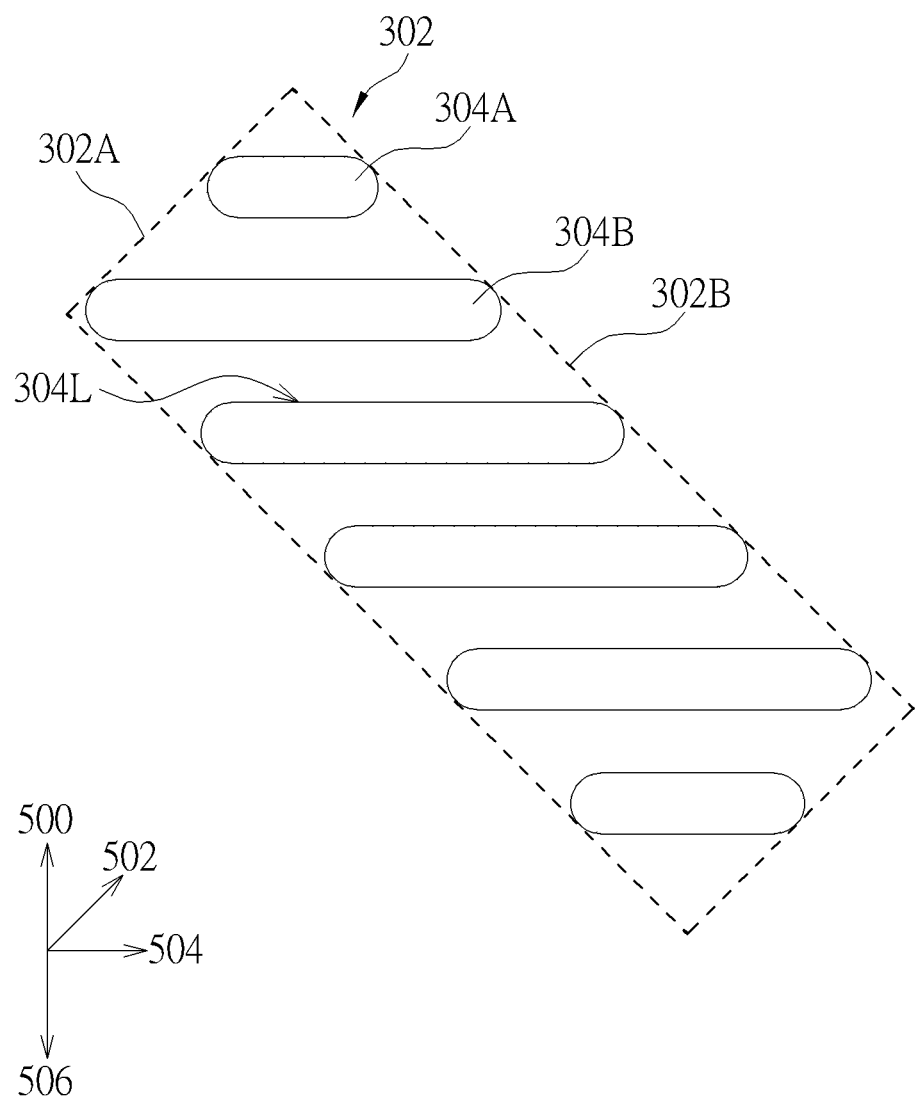
FIG. 7 shows a schematic diagram of the compensation effect along the third direction and the fourth direction of the overlay mark according to one embodiment of the present invention.

Please refer to FIG. 7, which shows a schematic diagram of the compensation effect along the third direction and the fourth direction of the overlay mark according to one embodiment of the present invention. FIG. 7 shows one first pattern block 302 which is composed of plural first stripe patterns 304. Since there is 45 degrees between the first stripe patterns 304 (which extends along the third direction 504) and the width 302A of the first pattern block 302 (which extends along the first direction 500) or the length 302B of the pattern block 302 (which extends along the second direction 502), the overlay measurement error of each first stripe pattern 304 along two dimensional axis (x-y axis, third direction 504 and fourth direction 506 for example) can therefore be compensated. For example, the compensation can be established between the measurement of the overlay shift between the first stripe pattern 304A and the first stripe pattern 304B along the length 302B and that along the width 302A. Thus, although there may be shape variation between each first stripe pattern 304, the measurement of which can still be compensated. As such, the measurement accuracy of both the x-direction (the third direction 504 for example) and the y-direction (the fourth direction 506 for example) can be ensured by using the two separated orthogonally first stripe patterns 304 (or two first pattern blocks 302)

In summary, the present invention provides a simple overlay target for improving the optical overly alignment or measurement formed on wafer. Since there is 45 degrees between the third direction where the first pattern block extends along and the first direction where the border of the first pattern block extends along, the measurement for the overlay mark can be well compensated and a precise result of the manufacturing process can therefore be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay target for optically measuring overlay alignment of layers formed on a semiconductor wafer, comprising:
    a plurality of first pattern blocks; and
    a plurality of second pattern blocks,
    wherein the first pattern blocks and the second patterns blocks are arranged in array by being separated by at least one first gaps stretching along a first direction and at least one second gaps stretching along a second direction,
    wherein each first pattern block is composed of a plurality of first stripe patterns stretching along a third direction, and each second pattern block is composed of a plurality of second stripe patterns stretching along a fourth direction,
    wherein the first direction is orthogonal to the second direction, the second direction and the fourth direction are 45 degrees relative to the first direction.

2. The overlay target according to claim 1, wherein the third direction is parallel to the fourth direction.

3. The overlay target according to claim 1, wherein the third direction is orthogonal to the fourth direction.

4. The overlay target according to claim 1, wherein an outmost contour of the overlay target is a rectangle.

5. The overlay target according to claim 4, wherein the outmost contour has a set of first borders stretching along the first direction and a set of second borders stretching along the second direction.

6. The overlay target according to claim 1, wherein an outmost contour of the first pattern block is a rectangle.

7. The overlay target according to claim 6, wherein the outmost contour of the first pattern has a set of first borders stretching along the first direction and a set of second borders stretching along the second direction.

8. The overlay target according to claim 1, wherein an outmost contour of the second pattern block is a rectangle.

9. The overlay target according to claim 8, wherein the outmost contour of the second pattern has a set of first borders stretching along the first direction and a set of second borders stretching along the second direction.

10. The overlay target according to claim 1, wherein the contour of the first stripe pattern is a trapezoid.

11. The overlay target according to claim 10, wherein the contour of the first stripe pattern has a set of border stretching along the third direction.

12. The overlay target according to claim 1, wherein the contour of the second stripe pattern is a trapezoid.

13. The overlay target according to claim 1, wherein the contour of the second stripe pattern has a set of border stretching along the third direction.

14. The overlay target according to claim 1, wherein the wafer has a plurality of die regions which are arranged in array by being separated by plural first scribe lines stretching along the third direction and plural second scribe lines stretching along the fourth direction.

15. The overlay target according to claim 14, wherein the overlay target is disposed in one of the first scribe lines or one of the second scribe lines.

16. The overlay target according to claim 1, further comprising a plurality of active stripe patterns in the die region, wherein the active stripe patterns stretch along the third direction or the fourth direction.

17. The overlay target according to claim 1, wherein the overlay target is invariant to 180 degrees rotation about a rotation center.

18. The overlay target according to claim 1, wherein the overlay target can be divided into four regions, each region containing an equal numbers of the first pattern blocks plus the second pattern blocks.

19. The overlay target according to claim 18, wherein in the same region, a number of the first pattern blocks is equal to a number of the second pattern blocks.

20. The overlay target according to claim 1, wherein a central region is defined in the overlay target, wherein there are only the first pattern blocks in the central region.

* * * * *